Figure 1A:
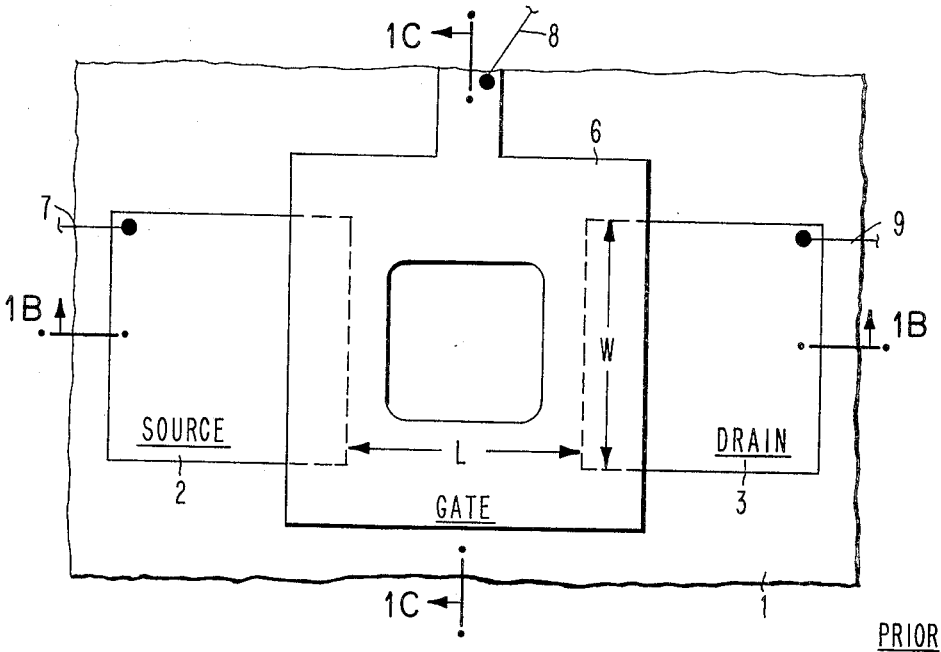
FIG. 1A PRIOR ART
Figure 1B:
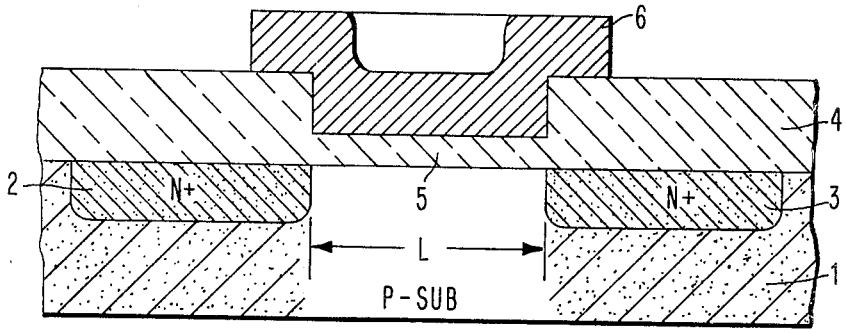
FIG. 1B PRIOR ART
Figure 1C:
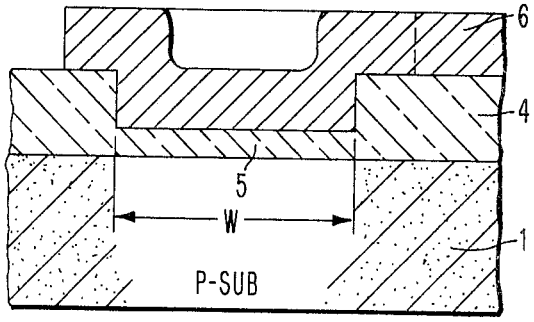
FIG. 1C PRIOR ART
Figure 2A:
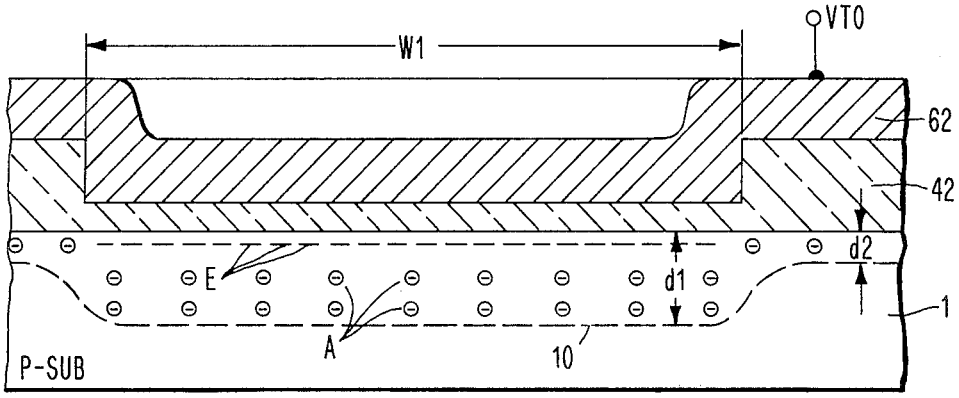
FIG. 2A PRIOR ART
Figure 2B:
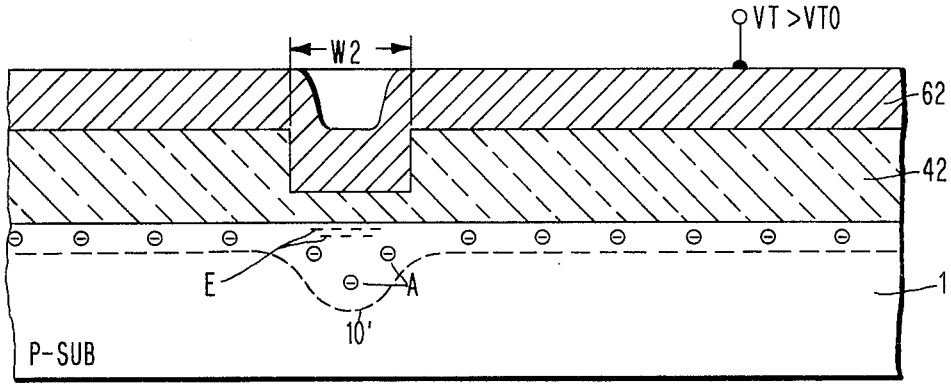
Figure 3A:
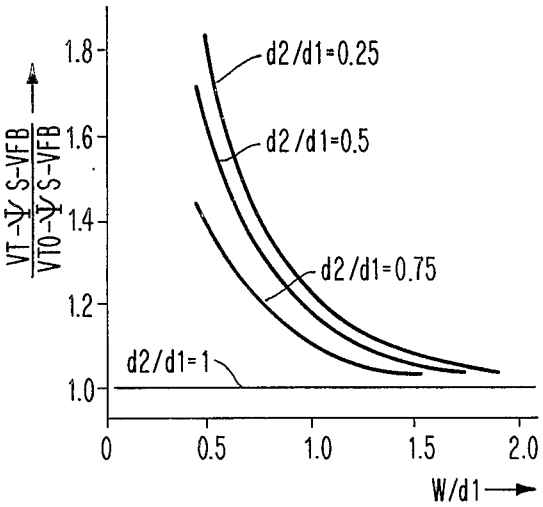
Figure 3B:
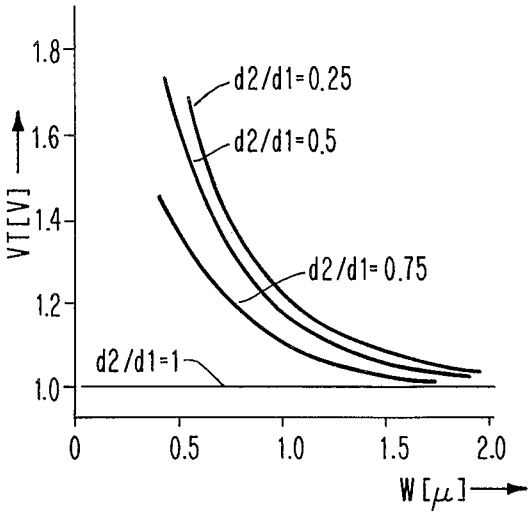
Figure 4A:
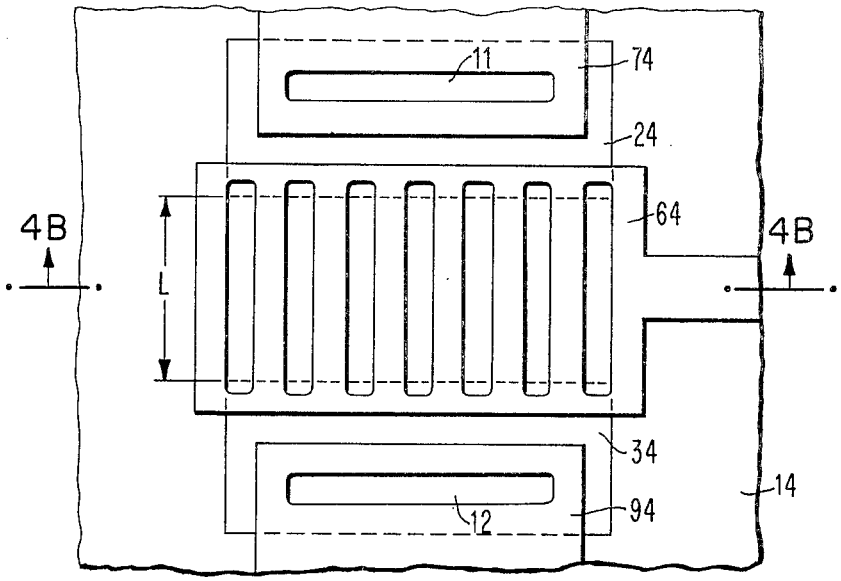
Figure 4B:
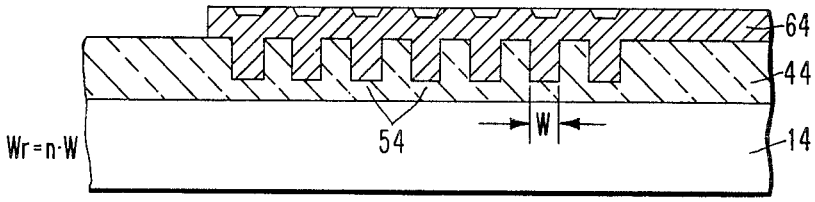
Figure 5A:
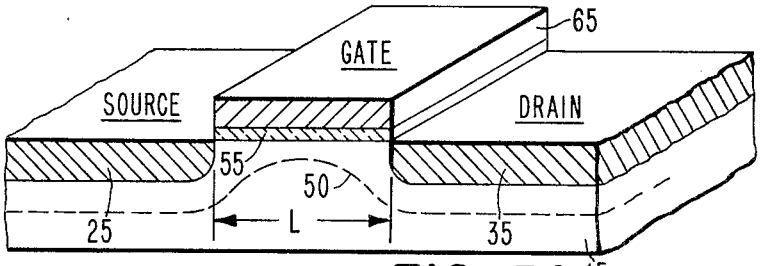
FIG. 5A PRIOR ART
Figure 5B:
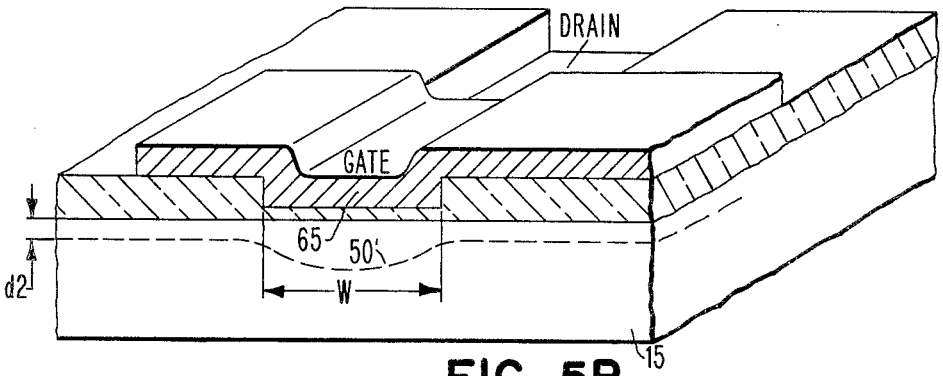
Figure 6:
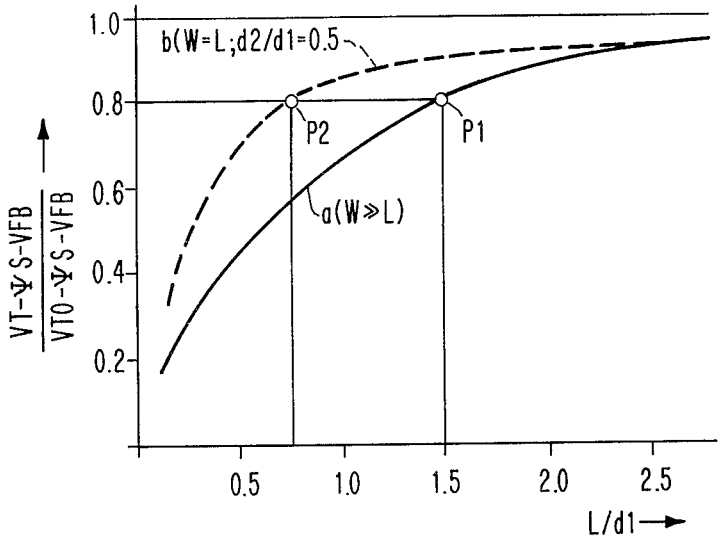
Figure 7A:
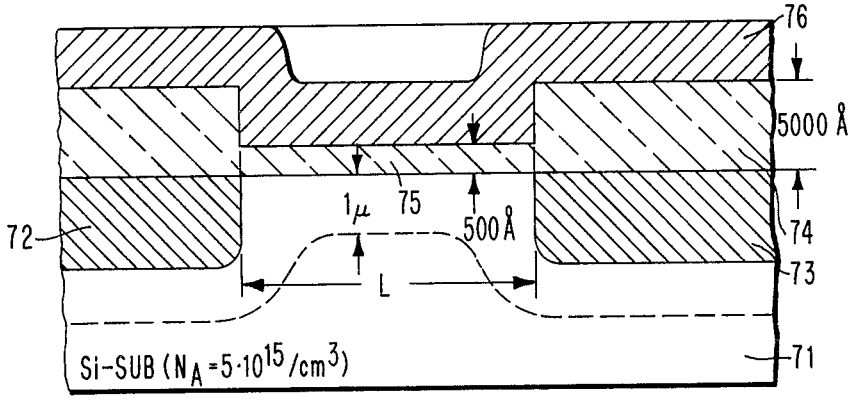
Figure 7B:
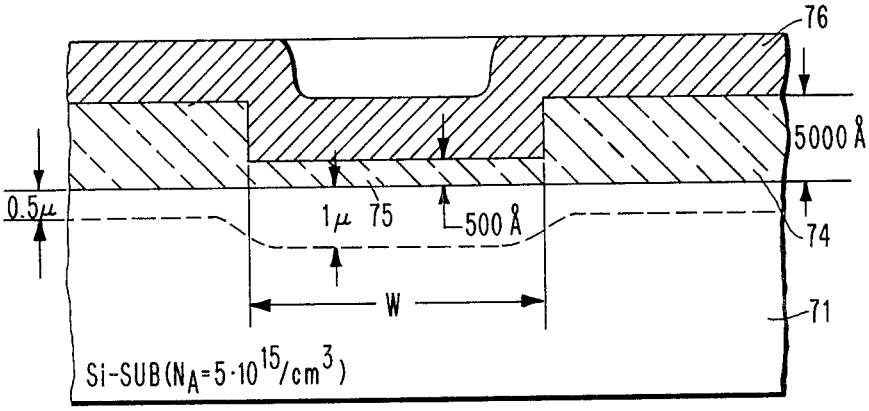

United States Defensive Publication [19] (H) [11] T954,008

Baitinger et al. [43] Jan. 4, 1977

[54] NARROW CHANNEL FIELD EFFECT TRANSISTOR

[75] Inventors: Utz G. Baitinger, Stuttgart; Otto G. Folberth; Werner O. Haug, both of Boeblingen; Karl E. Kroell, Stuttgart, all of Germany

[73] Assignee: International Business Machines Corporation, Armonk, N.Y.

[21] Appl. No.: 647,251

[22] Filed: Jan. 7, 1976

Related U.S. Application Data

[63] Continuation of Ser. No. 481,016, June 20, 1974, abandoned.

[30] Foreign Application Priority Data

July 28, 1973 Germany ..... 2338388

[51] Int. Cl.[2] ..... H01L 29/78

[52] U.S. Cl. ..... 357/23; 357/52

[57] ABSTRACT

A field effect transistor having a channel width of such small dimension that threshold voltage becomes inversely related to channel width allowing the fabrication of field effect transistors of differing threshold voltages while using the same process steps. Reduced threshold voltage due to prior art "short channel length" effect may be offset by the presently disclosed narrow channel width effect. Desired chanel impedance values are achieved independently of threshold voltage influence due to narrow channel width effect by the provision of parallel-connected field effect transistors of the same channel length whose total channel widths yield a desired net width-to-length ratio.

5 Claims, 4 Sheets Drawing, 21 Pages Specification

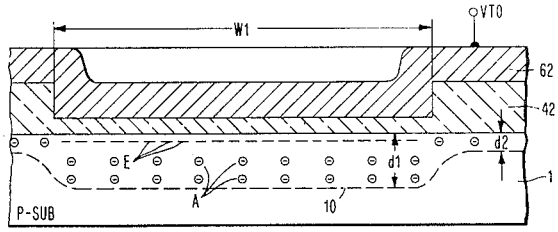

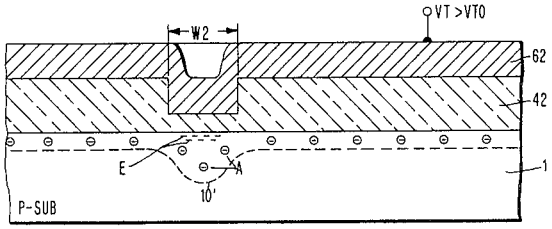

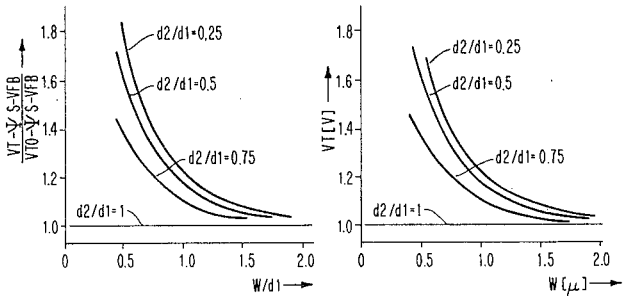

The file of this unexamined application may be inspected and copies thereof may be purchased (849 O.G. 1221, Apr. 9, 1968).